United States Patent
Penta

(10) Patent No.: US 11,186,748 B2
(45) Date of Patent: *Nov. 30, 2021

(54) AQUEOUS ANIONIC FUNCTIONAL SILICA SLURRY AND AMINE CARBOXYLIC ACID COMPOSITIONS FOR SELECTIVE NITRIDE REMOVAL IN POLISHING AND METHODS OF USING THEM

(71) Applicant: Rohm and Haas Electronic Materials CMP Holdings, Inc., Newark, DE (US)

(72) Inventor: Naresh Kumar Penta, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 393 days.

This patent is subject to a terminal disclaimer.

(21) Appl. No.: 15/719,020

(22) Filed: Sep. 28, 2017

(65) Prior Publication Data

US 2019/0092971 A1   Mar. 28, 2019

(51) Int. Cl.
| | |
|---|---|
| C09G 1/02 | (2006.01) |
| B24B 37/04 | (2012.01) |
| C09K 3/14 | (2006.01) |
| B24B 1/00 | (2006.01) |
| C09G 1/04 | (2006.01) |
| C09K 13/06 | (2006.01) |
| H01L 21/306 | (2006.01) |
| C09G 1/00 | (2006.01) |
| C09G 1/06 | (2006.01) |
| H01L 21/321 | (2006.01) |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1409* (2013.01); *C09K 3/1436* (2013.01); *C09K 13/06* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | |
|---|---|---|
| 7,217,989 B2 | 5/2007 | Hiramitsu et al. |
| 7,316,603 B2 | 1/2008 | Carter et al. |
| 7,531,105 B2 | 5/2009 | Dysard et al. |
| 8,419,970 B2 | 4/2013 | Kamimura |
| 8,492,277 B2 | 7/2013 | Guo et al. |
| 8,529,787 B2 | 9/2013 | Higuchi et al. |
| 8,759,216 B2 | 6/2014 | Dysard et al. |
| 8,778,212 B2 | 7/2014 | Jin et al. |
| 8,840,798 B2 | 9/2014 | Han et al. |
| 9,028,572 B2 | 5/2015 | Grumbine et al. |
| 9,238,753 B2 | 1/2016 | Reiss et al. |
| 9,499,721 B2 | 11/2016 | Grumbine et al. |
| 9,558,959 B2 | 1/2017 | Mishra et al. |
| 2013/0014680 A1 | 1/2013 | Corbani |
| 2015/0221521 A1* | 8/2015 | Hou .................... H01L 21/3212 |
| | | 438/693 |

FOREIGN PATENT DOCUMENTS

| | | |
|---|---|---|
| JP | 2016069465 A | 5/2016 |
| JP | 6028046 B2 | 11/2016 |
| WO | 2010134542 A1 | 11/2010 |
| WO | 2016117589 A1 | 7/2016 |

OTHER PUBLICATIONS

K. Cheemalapati et al., "Key Chemical Components in Metal CMP Slurries", in Microielectronic Applications of Chemical Mechanical Planarization, edited by Y. Li, John Wiley & Sons, Inc., pp. 214-219 (Year: 2008).*
Glencoe Science, Text Book "Chemistry, Matterand Change", Published by McGraw-Hill, New York, pp. 542-543. (Year: 2005).*

* cited by examiner

*Primary Examiner* — Jiong-Ping Lu
(74) *Attorney, Agent, or Firm* — John J. Piskorski

(57) ABSTRACT

The present invention provides aqueous chemical mechanical planarization polishing (CMP polishing) compositions comprising one or more dispersions of a plurality of elongated, bent or nodular anionic functional colloidal silica particles or their mixture with one or more dispersions of anionic functional spherical colloidal silica particles, one or more amine carboxylic acids having an isoelectric point (pI) below 5, preferably, an acidic amino acid or pyridine acid, and, preferably, one or more ethoxylated anionic surfactants having a $C_6$ to $C_{16}$ alkyl, aryl or alkylaryl hydrophobic group, wherein the compositions have a pH of from 3 to 5. The compositions enable good silicon nitride removal and selectivity of nitride to oxide removal in polishing.

7 Claims, No Drawings

AQUEOUS ANIONIC FUNCTIONAL SILICA SLURRY AND AMINE CARBOXYLIC ACID COMPOSITIONS FOR SELECTIVE NITRIDE REMOVAL IN POLISHING AND METHODS OF USING THEM

The present invention relates to aqueous chemical mechanical planarization (CMP) polishing compositions comprising an abrasive of one or more dispersions of elongated, bent or nodular anionic functional colloidal silica particles or their mixture with one or more dispersions of anionic functional spherical colloidal silica particles, one or more amine carboxylic acids having an isoelectric point (pI) below 5, and, preferably, an ethoxylated anionic surfactant having a hydrophobic group, wherein the compositions have a pH of from 3 to 5.

As the technology for integrated circuit devices advances, traditional materials such as silicon nitride, silicon dioxide and polysilicon are being used in various combinations to achieve and enable desired architectural configurations and device performance. Conventional polishing slurries have been designed for "stop on silicon nitride" applications such as in shallow trench isolation (STI). More recently, the density of integrated circuits has continued to increase, leading to a number of new front end of the line (FEOL) structures that benefit from CMP polishing, including replacement metal gates, contact plugs, and substrates treated by conductive metallization. In such structures, silicon nitrides serve as the etch stop layer, capping material, and hard mask. In addition, silicon nitride finds increasing use as a diffusion or passivation layer, spacer material, and liner. In all such schemes, silicon nitride is used in combination with other dielectric films such as silicon oxide or tetraethoxysilane (TEOS). Thus, most patterned wafers now contain both nitride and oxide dielectric films at different density; further, feature size steps involving such integration schemes require selective CMP polishing or removal of silicon nitride films without removing the oxide dielectric material. Other methods needing nitride: oxide selective CMP polishing compositions are "Reverse STI processes" where trenches are etched in the dielectric oxide and filled with a dielectric nitride cap; and alternatives to conventional "Etch Back processes" where CMP polishing is used in addition to or instead of etching. One such example of the alternative etching process is self-aligned contact (SAC) capping. In SAC capping, replacement metal gates (RMG) have been formed of an excess of metal, such as tungsten, that has been removed by CMP polishing, and then has been etched down by reactive ion etching (RIE) which forms narrow gaps in the wafer. The gaps are then filed with silicon nitride (SiN). CMP polishing then removes excess nitride and stops on the oxide surface.

In each case in the prior paragraph, new FEOL architectures like SAC require a reverse selectivity, i.e., a high nitride removal rate with a low oxide removal rate, in CMP polishing to remove the excess dielectric. In SAC, complete clearing of the nitride layer over existing oxide layers is critical to avoid blocking oxide etching in successive steps. However, over polishing of the nitride would thin the nitride SAC cap, risking an electrical short. Therefore CMP with high selectivity CMP polishing is critical. The new FEOL architectures all result in a structure in which a predetermined pattern of the dielectric nitride is inlaid in the silicon wafer. Such CMP polishing requires the removal and planarization of a silicon nitride overburden, thereby resulting in a coplanar surface with the silicon nitride-filled trenches, plugs, or gaps. An acceptable nitride:oxide removal rate ratio is necessary to prevent damage to the underlying Si active areas and provide an over polish margin to ensure all pattern densities are cleared of the nitride. Further, dishing of the nitride in any trench, cap or gap must be avoided to prevent low threshold voltage leaks in finished structures.

Presently, users of aqueous chemical, mechanical planarization polishing (CMP polishing) compositions used with CMP polishing pads to polish substrates wish to avoid the use of ceria containing CMP polishing compositions. Silica slurry formulations offer lower cost, defect-free solutions, but, to date, have suffered from unsatisfactory nitride to oxide selectivity for use, especially on patterned wafers.

U.S. Pat. No. 9,558,959 B2, to Mishra et al. discloses a chemical mechanical polishing composition for polishing a substrate, the composition comprising an anionic abrasive, which may be colloidal silica dispersion having anionic particles and one or more nitride removal rate enhancer, such as a carboxylic acid or its salt. The chemical species in the silica particles can be an acidic compound. The nitride removal rate enhancer can be any of scores of compounds and may include amino acetic acid. Of the many such nitride removal rate enhancers and many abrasive species disclosed, however, Mishra fails to disclose any composition in which any amine carboxylic acids which increases the selectivity of dielectric nitride:dielectric oxide removal rates. Further, Mishra appears to require both a chemical species in the silica particle and a separate nitride removal rate enhancer additive.

The present inventors have endeavored to solve the problem of providing aqueous silica slurries which enable acceptable nitride removal and nitride:oxide removal rate selectivity for use in SAC applications, as well as methods for using the slurries.

STATEMENT OF THE INVENTION

1. In accordance with the present invention, aqueous chemical mechanical planarization polishing (CMP polishing) compositions comprise an abrasive of one or more dispersions of elongated, bent or nodular anionic functional colloidal silica particles or their mixture with one or more dispersions of anionic functional spherical colloidal silica particles, one or more amine carboxylic acids having an isoelectric point (pI) below 5, preferably, acidic amino acids or pyridine acids having pI of from 2.0 to 4.0, and, preferably, one or more ethoxylated anionic surfactants having a $C_6$ to $C_{16}$ alkyl, aryl or alkylaryl hydrophobic group, or, preferably, a $C_6$ to $C_{10}$ alkyl, aryl or alkylaryl hydrophobic group, preferably, at least one ethoxylated sulfate surfactant, wherein the compositions have a pH of from 3 to 5 or, preferably, from 3.5 to 4.5, further wherein, the amount of the abrasive particles as solids, ranges from 0.01 to 30 wt. %, or, preferably, from 0.1 to 10 wt. %, or, more preferably, from 0.1 to less than 1 wt. %, based on the total weight of the composition.

2. In accordance with the aqueous CMP polishing compositions as set forth in item 1, above, wherein the weight average particle sizes (CPS) of the abrasive anionic functional colloidal silica particles ranges in the one or more dispersions of colloidal silica particles or a weighted average of such particle sizes in a mixture thereof ranges from 10 nm to 200 nm, or, preferably, from 20 nm to 50 nm.

3. In accordance with the aqueous CMP polishing compositions as set forth in any one of items 1, or 2, above, wherein the one or more amine carboxylic acids is chosen from acidic amino acids or pyridine acids, or, more preferably, is chosen from nicotinic acids, picolinic acids, glutamic acid or aspartic acid.

4. In accordance with the aqueous CMP polishing compositions as set forth in item 3, above, wherein the total solids amount of the one or more amine carboxylic acids ranges from 0.005 to 5 wt. % or, preferably, in the amount of from 0.01 to 1 wt. % or, more preferably, in the amount of from 0.02 to 0.5 wt. %, based on the total weight of the composition.

5. In accordance with the aqueous CMP polishing compositions as set forth in any one of items 1, 2, 3, or 4, above, wherein the ethoxylated anionic surfactant is chosen from ethoxylated sulfates, ethoxylated sulfonic acid, ethoxylated sulfonate salts, ethoxylated phosphates, ethoxylated phosphonates, or ethoxylated carboxylates, preferably, ethoxylated sulfates.

6. In accordance with the aqueous CMP polishing compositions as set forth in any one of items 1, 2, 3, 4, 5, or 6, above, wherein the amount of the ethoxylated anionic surfactant ranges from 0.0001 to 1 wt. %, or, preferably, from 0.01 to 0.1 wt. %.

7. In accordance with another aspect of the present invention, methods of using the aqueous CMP polishing compositions comprise polishing a substrate with a CMP polishing pad and an aqueous CMP polishing composition as set forth in any one of items 1 to 6, above.

8. In accordance with the methods of the present invention as set forth in item 7, above, wherein the substrate comprises both silicon dioxide or tetraethoxysilicate (TEOS) and silicon nitrides, as SiN or $Si_3N_4$ or their mixtures, and the polishing results in a nitride:oxide removal rate ratio of at least 8:1, for example, from 8:1 to 100:1 or, preferably, from 10:1 to 80:1.

9. In accordance with the methods of the present invention for polishing a substrate as in any one of items 7 or 8, above, wherein the polishing downforce ranges from 6.89 kPa (1.0 psi) to 41.37 kPa (6 psi) or, preferably, from 10.34 kPa (1.5 psi) to 20.68 kPa (3 psi).

10. In accordance with the methods of the present invention for polishing a substrate as in any one of items 7, 8, or 9, above, wherein the CMP polishing composition comprises a total of from 0.1 to 5 wt. %, or, preferably, from 0.1 to 3 wt. %, as solids, of the colloidal silica particles. The CMP polishing compositions may be stored and shipped as a concentrate and then diluted with water at the time of polishing the substrate.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "amine carboxylic acid" means any organic compound which contains at least one carboxyl group and at least one amine or ammonia group. As used, an "amine carboxylic acid" is not limited to naturally occurring amino acids or just those amino acids that form peptide bonds. For example, pyridine carboxylic acids are amino acids that are not likely to form peptide bonds.

As used herein, the term "ASTM" refers to publications of ASTM International, West Conshohocken, Pa.

As used herein, the term "colloidally stable" means that a given composition does not gel or precipitate, and remains clear upon visible inspection after a given time and at a given temperature.

As used herein, the term "isoelectric point" or "pI", for an amine carboxylic acid is the pH at which the amine carboxylic acid does not migrate in an electric field or electrophoretic medium; the pI refers to (i) the average of the two pKas in neutral amine carboxylic acids; (ii) the average of the two lowest pKas in acidic amine carboxylic acids (which have 2 carboxyl groups); and (iii) the average of the two highest pKas in basic amine carboxylic acids (which have two amine groups. A detailed explanation of "isoelectric point" and its calculation follows in the examples, below. Further, as used herein, the term "pI of the total abrasive" means a weighted average of the pI of each of the one or more dispersions of colloidal silica particles. Thus, if there is one such dispersion of colloidal silica particles, then the pI of the total abrasive equals the pI of that dispersion; if there is a 50/50 w/w mixture of two such dispersions and the pI of one such dispersion is 3.5 and the pI of the other such dispersion is 4.5, then the pI of the total abrasive is (3.5×0.5)+(4.5×0.5) or 4.0.

As used herein, the term "ISO" refers to publications of the International Organization for Standardization, Geneva, CH.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "silica particle solids" or "silica solids" means, for a given composition, the total amount of spherical silica particles, plus the total amount of elongated, bent or nodular silica particles, including anything with which any of those particles are treated.

As used herein, the term "solids" means any material other than water or ammonia that does not volatilize in use conditions, no matter what its physical state. Thus, liquid amino acids, or additives that do not volatilize in use conditions are considered "solids".

As used herein, the term "strong acid" refers to protic acids having a pKa of 2 or less, such as inorganic acids like sulfuric or nitric acid.

As used herein, the term "use conditions" means the temperature and pressure at which a given composition is used, including increases in temperature and pressure during or as a result of use.

As used herein, the term "weight fraction silica" means the total wt. % of silica, based on the total weight of the composition/100%. Thus, 30 wt. % silica equates to a weight fraction of 0.3.

As used herein, the term "wt. %" stands for weight percent.

As used herein, the term "zeta potential" refers to the charge of a given composition as measured by a Malvern Zetasizer instrument. Unless otherwise indicated, all zeta potential measurements were made on (diluted) slurry compositions as described in the examples. The reported value was taken from an averaged measurement of zeta values using >20 acquisitions taken by the instrument for each indicated composition.

The present inventors have surprisingly found that an aqueous CMP polishing composition of an abrasive of colloidal silica particles which contain an anionic charge and an amine carboxylic acid having an isoelectric point below 5 enables never before achieved removal rate selectivity of dielectric nitrides substrates, such as silicon nitrides, to dielectric oxide substrates, such as silicon oxides.

The aqueous CMP polishing compositions in accordance with the present invention provide a dielectric nitride:dielectric oxide substrate removal rate selectivity ratio of from 8:1 to 100:1, or, preferably, from 10:1 to 80:1. The selectivity ratio is improved at the preferred pH of 3.5 to 4.5 and when using a higher concentration of the preferred amine carboxylic acid. The methods in accordance with the present invention use the compositions of the present invention to provide dielectric nitride:dielectric oxide removal rate ratios of from 8:1 to 100:1, or, preferably, from 10:1 to 80:1.

Preferably, in accordance with the present invention the dielectric oxide and dielectric nitride substrates are, respectively, silicon oxides and silicon nitrides.

In accordance with the present invention, suitable colloidal silica compositions may comprise a dispersion of silica made by conventional sol gel polymerization or by the suspension polymerization of water glass so as to produce a plurality of spherical colloidal silica particles, or of elongated, bent or nodular silica particles in a distribution or mixture that may include a plurality of colloidal silica particles of various sizes.

Suitable dispersions of elongated, bent or nodular colloidal silica particles are made from suspension polymerization by hydrolytic condensation of silanols formed in a known manner from precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation may comprise reacting the precursors in aqueous suspension in the presence of a basic catalyst, such as an alkylammonium hydroxides, alkoxyalkyl amines, such as ethoxypropylamine (EOPA), alkylamines or KOH, preferably, tetramethylammonium hydroxide. The elongated, bent or nodular silica particles are anionic at a pH of 3 to 5.

The anionic functional groups in the one or more dispersions of colloidal silica particles can be sulfonic acid, such as is disclosed in World Intellectual Property Organization (WIPO) publication WO2010134542A1. In that publication, the sulfonic acid modification of silica comprises adding to silica a silane coupling agent having a functional group (a) which can be chemically converted into a sulfonic acid group to colloidal silica, and then converting the functional group (a) into a sulfonic acid group. For example, the silica coupling agent, 3-mercapto propyl trimethoxysilane, which has a mercapto group and/or sulfide group can be converted to a sulfonic acid group by use of an oxidizer, such as hydrogen peroxide. Other suitable anionic functional groups on the silica surface can be phosphonic acid.

Suitable dispersions of bent or nodular anionic colloidal silica particles are available from Fuso Chemical Co., Ltd., Osaka, JP (Fuso) under the tradenames PL-1-D and, PL-3-D slurries.

To insure colloidal stability of the aqueous CMP polishing compositions of the present invention and to insure that the isoelectric point of the amine carboxylic acids is greater than the pI of the total abrasive, the compositions have a pH ranging from 3 to 5 or, preferably, from 3.5 to 4.5.

The one or more amine carboxylic acids in accordance with the present invention has a pI expressed as a pI equal to or less than 5, or, preferably, from 2.0 to 4.0. Further, the present invention encompasses compositions comprising mixtures of more than one amine carboxylic acids; in such a case the pI of the amine carboxylic acid mixture is the weighted average of the pI of each amine carboxylic acid (in the same way as with the total abrasive as disclosed, above).

The aqueous CMP polishing compositions in accordance with the present invention have a negative zeta potential because they are used at a pH above their isoelectric point. Preferably, the abrasives in the aqueous CMP polishing compositions of the present invention have a zeta potential of from −5 to −50 mV at the operating or given pH. Such a zeta potential helps control colloidal stability and nitride to oxide RR ratio.

To improve the dielectric nitride removal rate achieved when using the aqueous compositions of the present invention, the compositions of the present invention may further comprise polymers or anionic group modified structures of amine carboxylic acids.

The aqueous CMP polishing compositions of the present invention may comprise other modified additives, such as (poly)aspartic acids, in amounts of up to 1 wt. %, based on total solids.

Desirably, the CMP polishing of the present invention is carried out such that the silicon nitride is substantially removed and the silicon dioxide is adequately planarized without excessive erosion or dishing of dielectric nitride.

In use, CMP polishing of a wafer substrate involves providing a silicon substrate on which is deposited a layer of silicon oxide. Following metallization or photolithography, trenches, holes, hollows or gaps are etched onto the substrate comprising an overlying layer of silicon oxide, and an excess of dielectric, for example, silicon nitride is deposited thereon. The substrate is then subjected to planarization until the surface layer of silicon nitride is substantially removed and the surface layer of silicon oxide is exposed but not substantially removed, such that the dielectric or silicon nitride remaining in the trenches is approximately level with the silicon oxide in the edges of the trenches, holes, hollows or gaps.

EXAMPLES

The following examples illustrate the various features of the present invention.

In the Examples that follow, unless otherwise indicated, conditions of temperature and pressure are ambient temperature and standard pressure.

The following materials, including those listed in Table 1, below, were used in the Examples that follow:

Surfactant A: Witcolate™ 1247H surfactant (Akzo Nobel, Arnhem, N L), a $C_6$-$C_{10}$ alcohol ethoxylated ammonium sulfate having 3 ethoxy groups, wherein $C_6$ comprises 15-21% of the alkyl groups, $C_8$ comprises 31-38.5% of the alkyl groups and $C_{10}$ comprises 42-50% of the alkyl groups.

TABLE 1

Elongated Silica and Other Abrasive Particles

| Aqueous Silica Slurry | Source | pH[2] | Secondary Particle size (DLS, nm) | Raw Materials | Concentration[2] (wt. % solids) |
|---|---|---|---|---|---|
| Slurry A | QUARTRON™ PL-1-D[1] | ~5-7 | 30-40 | TMOS | 20 |
| Slurry B | QUARTRON™ PL-3-D[1] | ~5-7 | 60-80 | TMOS | 20 |
| Slurry C* | QUARTRON™ PL-3[1] | ~5-7 | 60-80 | TMOS | 20 |

[1]Fuso Corp., Japan;
[2]pH as delivered from source;
*denotes comparative example.

The various silica particles used in the Examples are listed in Table 1, above. Each of the silica Slurry A and Slurry B contained sulfonic acid functional groups. Comparative slurry, Slurry C does not contain the anionic functional groups of the present invention.

The following abbreviations were used in the Examples that follow:

POU: Point of use; RR: Removal rate.

Isoelectric Points of Amine Carboxylic Acids: The isoelectric point or pI of an amine carboxylic acid is the pH at which the amine carboxylic acid does not migrate in an electric field or electrophoretic medium. For purposes of defining pI, pKas are assigned a numerical value from lowest pH to highest pH. Amine carboxylic acids having neutral side chains are characterized by two pKas: pKa1 for the carboxylic acid and pKa2 for the amine. The pI will be halfway between, or the average of, these two pKas, i.e. pI=½(pKa1+pKa2). At a pH below pKa1, the amine carboxylic acid will have an overall positive charge and at a pH above pKa2, the amine carboxylic acid will have an overall negative charge. For the simplest amine carboxylic acid, glycine, pKa1=2.34 and pKa2=9.6, pI=5.97. Acidic amine carboxylic acids have an acidic side chain. The pI will be at a lower pH because the acidic side chain introduces an extra negative charge. For example, for aspartic acid there are two acid pKas ($pKa_1$ and $pKa_2$) and one amine pKa, $pKa_3$. The pI is halfway between these two acid pKa values, i.e. pI=½($pKa_1$+$pKa_2$), so pI=2.77. Basic amine carboxylic acids have a pI at a higher pH because the basic side chain introduces an extra positive charge. For example, for histidine, pI is halfway between the two ammonia hydrogen pKa values, pI=½($pKa_2$+$pKa_3$), so pI=7.59. The pI of many amine carboxylic acids is shown in Table 2, below.

TABLE 2

Pkas And Isoelectric Points Of Amine carboxylic acids

| Amine carboxylic acid | pKa1 | pKa2 | pKa3 | pI |
|---|---|---|---|---|
| Aspartic acid | 1.88 | 3.65 | 9.6 | 2.77 |
| Glutamic acid | 2.19 | 4.25 | 9.67 | 3.22 |
| nicotinic acid | 2 | 4.85 | — | 3.425 |
| picolinic acid | 1.07 | 5.25 | — | 3.16 |
| Cysteine | 1.96 | 8.18 | — | 5.07 |
| Asparagine | 2.02 | 8.8 | — | 5.41 |
| Phenylalanine | 1.83 | 9.13 | — | 5.48 |
| Threonine | 2.09 | 9.1 | — | 5.6 |
| Glutamine | 2.17 | 9.13 | — | 5.65 |
| Tyrosine | 2.2 | 9.11 | — | 5.66 |
| Serine | 2.21 | 9.15 | — | 5.68 |
| Methionine | 2.28 | 9.21 | — | 5.74 |
| Tryptophan | 2.83 | 9.39 | — | 5.89 |
| Valine | 2.32 | 9.62 | — | 5.96 |
| Glycine | 2.34 | 9.6 | — | 5.97 |
| Leucine | 2.36 | 9.6 | — | 5.98 |
| Alanine | 2.34 | 9.69 | — | 6 |
| Isoleucine | 2.36 | 9.6 | — | 6.02 |
| Proline | 1.99 | 10.6 | — | 6.3 |
| Histidine | 1.82 | 6 | 9.17 | 7.59 |
| Lysine | 2.18 | 8.95 | 10.53 | 9.74 |
| Arginine | 2.17 | 9.04 | 12.48 | 10.76 |

The following test methods were used in the Examples that follow:

pH at POU: The pH at point of use (pH at POU) was that measured during removal rate testing after dilution of the indicated concentrate compositions with water to the indicated solids content.

Example 1

Polishing and Removal Rate: Blanket wafer removal rate testing from polishing on each of tetraethoxy silane (TEOS), silicon nitride and amorphous silicon (aSi) substrates was performed using a Strasburgh 6EC 200 mm wafer polisher or "6EC RR" (Axus Technology Company, Chandler, Ariz.) at a downforce of 20.68 kpa (3 psi) and table and carrier revolution rates (rpm), respectively, of 93 and 87, and with an IC1000™ CMP polishing pad having a 1010 groove pattern (Dow, Midland, Mich.) and the indicated abrasive slurry, as shown in Table 3, below, at a given abrasive slurry flow rate 200 ml/min. A SEASOL™ AK45 AM02BSL8031C1 diamond pad conditioner disk (Kinik Company, Taiwan) was used to condition the polishing pad. The polishing pad was conditioned in situ during polishing using a down force of 3.17 kg (7.0 lbf) at 10 sweeps/min from 4.32 cm to 23.37 cm from the center of the polishing pad. The removal rates were determined by measuring the film thickness before and after polishing using a KLA-Tencor™ FX200 metrology tool (KLA Tencor, Milpitas, Calif.) using a 49 point spiral scan with a 3 mm edge exclusion. Removal Rate results and their ratios (selectively) are shown in Table 3, below.

TABLE 3

Slurry Formulation Details, Removal Rates (RR) and Selectivities

| Ex. No. | Slurry | Solids (wt. %) | Additive | Additive (wt %) | pH | Zeta potential (mV) | SiN RR (Å/Min) | TEOS RR, (Å/Min) | aSi RR (Å/Min) | SiN:TEOS RR ratio | SiN:aSi RR ratio |
|---|---|---|---|---|---|---|---|---|---|---|---|
| 1* | A | 3 | H$_3$PO$_4$ | 0.03 | 2.6 | −38 | 722 | 23 | 99 | 31 | 7 |
| 2* | A | 3 | H$_3$PO$_4$ | 0.06 | 2.3 | −37 | 730 | 30 | 130 | 24 | 6 |
| 3 | A | 3 | Nicotinic acid | 0.05 | 4.0 | −35 | 861 | 10 | 138 | 90 | 6 |
| 4 | A | 3 | Nicotinic acid | 0.1 | 3.6 | −35 | 933 | 10 | 112 | 89 | 8 |
| 5 | A | 3 | Nicotinic acid | 0.2 | 3.5 | −35 | 783 | 15 | 174 | 52 | 5 |
| 6 | B | 3 | Nicotinic acid | 0.05 | 3.8 | −45 | 493 | 36 | 27 | 14 | 18 |
| 7 | B | 3 | Nicotinic acid | 0.1 | 3.7 | −45 | 520 | 42 | 39 | 12 | 13 |

*Denotes Comparative Example.

As shown in Table 3, above, the aqueous abrasive slurry compositions in Examples 3 to 5 provides having amine carboxylic acid with an isoelectric point of <5, all achieve a high nitride RR but a low oxide RR, thereby providing high nitride to oxide selectivity (~100). Especially where the pH of the compositions lies at 4.0 or below. Such inventive examples provide good to excellent nitride to oxide polish selectivity. By comparison, the same compositions having phosphoric acid gave a lower nitride rate and a higher oxide removal rate. By comparison, the slurry B larger size abrasive particles provide lower nitride rate and higher oxide rate and, thus, lower nitride to oxide selectivity. Smaller size silica particles help increase nitride removal rate and lower oxide rate.

The examples in Table 4 below, demonstrate that effect of anionic functional groups.

TABLE 4

Slurry Formulation Details, Removal Rates (RR) and Selectivities

| Ex. No. | Slurry | Solids (wt. %) | Additive | Additive (wt %) | pH | Zeta potential (mV) | SiN RR (Å/Min) | TEOS RR, (Å/Min) | aSi RR (Å/Min) |
|---|---|---|---|---|---|---|---|---|---|
| 8* | C | 3 | Picolinic acid | 0.05 | 4.5 | −8 | 663 | 54 | 12 |
| 10 | B | 3 | Picolinic acid | 0.05 | 4.2 | −37 | 650 | 38 | 17 |
| 11 | B | 3 | Picolinic acid | 0.1 | 4.0 | −35 | 771 | 38 | 20 |

*Denotes Comparative Example.

As shown in In
Table 3: Slurry Formulation Details4, above, the compositions of Example 10 and 11 exhibit higher SiN;Ox selectivity but same SiN RR compared to the composition of Comparative Example 8 in which silica is does not contain anionic functional groups. Higher zeta potential only favors low oxide rates but has no effect on SiN RRs.

The Examples in Table 5, below, include surfactant A.

TABLE 5

Slurry Formulation Details, Removal Rates (RR) and Selectivities

| Ex. No | Solids (wt. % slurry A) | Nicotinic acid (wt. %) | Surfactant A (wt. %) | pH | SiN RR, Å/min | TEOS RR, Å/min | aSi RR, Å/min | SIN:TEOS RR ratio | SIN:aSi RR ratio |
|---|---|---|---|---|---|---|---|---|---|
| 12 | 3 | 0.1 | 0.0 | 3.6 | 933 | 10 | 112 | 89 | 8 |
| 13 | 3 | 0.1 | 0.0125 | 3.55 | 851 | 9 | 10 | 94 | 83 |
| 14 | 3 | 0.1 | 0.025 | 3.53 | 831 | 10 | 8 | 87 | 99 |

* Denotes Comparative Example.

As shown in Table 5, above, addition of Surfactant A C$_6$-C$_{10}$ alcohol ethoxylated sulfate) in the compositions of Examples 13-14 further improves SiN to aSi selectivity and is preferred over the compositions of Example 12.

I claim:

1. An aqueous chemical mechanical planarization polishing composition comprising an abrasive of one or more dispersions of elongated, bent or nodular anionic functional colloidal silica particles or their mixture with one or more dispersions of anionic functional spherical colloidal silica particles, and one or more amine carboxylic acids chosen from glutamic acid, aspartic acid, nicotinic acid and picolinic acid having an isoelectric point (pI) from 2.0 to 4.0, wherein the compositions have a pH of from 3 to 5 and further wherein, the amount of the abrasive particles as solids, ranges from 0.01 to 30 wt. %, based on the total weight of the composition.

2. The aqueous chemical mechanical polishing composition as claimed in claim 1, wherein the total solids amount of the one or more amine carboxylic acids ranges from 0.005 to 5 wt. %, based on the total weight of the composition.

3. The aqueous chemical mechanical polishing composition as claimed in claim 2, wherein the total solids amount of the one or more amine carboxylic acids ranges from 0.01 to 1 wt. %, based on the total weight of the composition.

4. The aqueous chemical mechanical polishing composition as claimed in claim 1, further comprising one or more ethoxylated anionic surfactants having a $C_6$ to $C_{16}$ alkyl, aryl or alkylaryl hydrophobic group.

5. The aqueous chemical mechanical polishing composition as claimed in claim 4, wherein the ethoxylated anionic surfactant is chosen from ethoxylated sulfates, ethoxylated sulfonic acid, ethoxylated sulfonate salts, ethoxylated phosphates, ethoxylated phosphonates, or ethoxylated carboxylates.

6. The aqueous chemical mechanical polishing composition as claimed in claim 4, wherein the amount of the ethoxylated anionic surfactant ranges from 0.0001 to 1 wt. %, based on the total weight of the composition.

7. The aqueous chemical mechanical polishing composition as claimed in claim 1 having a pH of from 3.5 to 4.5.

* * * * *